(12) United States Patent
Wu et al.

(10) Patent No.: US 10,189,988 B2
(45) Date of Patent: Jan. 29, 2019

(54) HIGH-CTI AND HALOGEN-FREE EPOXY RESIN COMPOSITION FOR COPPER-CLAD PLATES AND USE THEREOF

(71) Applicant: ZHUHAI EPOXY BASE ELECTRONIC MATERIAL CO., LTD., Zhuhai (CN)

(72) Inventors: Yongguang Wu, Zhuhai (CN); Renzong Lin, Zhuhai (CN); Huangming Song, Zhuhai (CN)

(73) Assignee: ZHUHAI EPOXY BASE ELECTRONIC MATERIAL CO., LTD., Zhuhai (CN)

( * ) Notice: Subject to any disclaimer, the term of this patent is extended or adjusted under 35 U.S.C. 154(b) by 0 days.

(21) Appl. No.: 15/511,324

(22) PCT Filed: Dec. 10, 2014

(86) PCT No.: PCT/CN2014/093414
§ 371 (c)(1),
(2) Date: Mar. 15, 2017

(87) PCT Pub. No.: WO2016/049981
PCT Pub. Date: Apr. 7, 2016

(65) Prior Publication Data
US 2017/0292018 A1    Oct. 12, 2017

(30) Foreign Application Priority Data

Sep. 29, 2014 (CN) .......................... 2014 1 0515073

(51) Int. Cl.
| | |
|---|---|
| *B32B 15/092* | (2006.01) |
| *C08L 63/00* | (2006.01) |
| *C08L 63/04* | (2006.01) |
| *B32B 37/06* | (2006.01) |
| *B32B 37/10* | (2006.01) |
| *B32B 37/12* | (2006.01) |
| *C08G 59/06* | (2006.01) |
| *C08G 59/30* | (2006.01) |
| *C08G 59/50* | (2006.01) |
| *C08G 59/56* | (2006.01) |
| *C08G 59/62* | (2006.01) |
| *C08G 59/68* | (2006.01) |
| *C08J 5/04* | (2006.01) |

(Continued)

(52) U.S. Cl.
CPC .............. *C08L 63/00* (2013.01); *B32B 37/06* (2013.01); *B32B 37/10* (2013.01); *B32B 37/12* (2013.01); *B32B 37/15* (2013.01); *C08G 59/063* (2013.01); *C08G 59/304* (2013.01); *C08G 59/5046* (2013.01); *C08G 59/56* (2013.01); *C08G 59/621* (2013.01); *C08G 59/686* (2013.01); *C08G 59/688* (2013.01); *C08J 5/043* (2013.01); *C08J 5/10* (2013.01); *C08J 5/24* (2013.01); *C08L 63/04* (2013.01); *C08L 63/06* (2013.01); *H05K 1/0353* (2013.01); *H05K 3/4611* (2013.01); *B32B 2038/168* (2013.01); *B32B 2305/076* (2013.01); *B32B 2305/18* (2013.01); *B32B 2309/02* (2013.01); *B32B 2311/12* (2013.01); *B32B 2457/08* (2013.01); *C08G 14/06* (2013.01); *C08J 2363/00* (2013.01); *C08J 2363/02* (2013.01); *C08J 2363/08* (2013.01); *C08J 2363/10* (2013.01); *C08L 61/06* (2013.01); *C08L 61/34* (2013.01); *C08L 2201/02* (2013.01); *C08L 2201/22* (2013.01); *C08L 2203/20* (2013.01); *C08L 2205/02* (2013.01); *C08L 2205/05* (2013.01); *H05K 1/0326* (2013.01); *H05K 2201/012* (2013.01); *H05K 2201/0209* (2013.01)

(58) Field of Classification Search
None
See application file for complete search history.

(56) References Cited

U.S. PATENT DOCUMENTS

| | | | | |
|---|---|---|---|---|
| 2010/0163783 A1* | 7/2010 | Fung | .................... | C08G 59/304 252/73 |
| 2011/0097587 A1* | 4/2011 | Chen | .................. | C08G 59/3272 428/417 |
| 2012/0136094 A1* | 5/2012 | Chen | .................... | C09D 163/00 523/451 |

FOREIGN PATENT DOCUMENTS

| | | |
|---|---|---|
| CN | 102382420 A | 3/2012 |
| CN | 103182831 A | 7/2013 |

(Continued)

OTHER PUBLICATIONS

Machine translation of JP 2005-272722 A (no date).*

(Continued)

*Primary Examiner* — Michael J Feely
(74) *Attorney, Agent, or Firm* — Schmeiser, Olsen & Watts, LLP

(57) ABSTRACT

A high-CTI and halogen-free epoxy resin composition for copper-clad plates and uses thereof is provided. The formula of the high-CTI and halogen-free epoxy resin composition for copper-clad plates comprises 100~140 parts of halogen-free phosphorous epoxy resin, 10~35 parts of dicyclopentadiene phenolic epoxy resin, 32~60 parts of benzoxazine, 1~5 parts of phenolic resin, 0.05~0.5 parts of accelerants; and 25~70 parts of fillers, by weight. The copper-clad plates, prepared according to embodiments of the present invention, can reach the requirements of high CTI (CTI≥500V), high heat resistance (Tg≥150° C., PCT, 2 h>6 min) and the level of flame retardance of UL-94 V0, and they are widely used in the electronic materials of electric machines, electric appliances, white goods and so on.

17 Claims, No Drawings

(51) Int. Cl.
    *C08J 5/10*         (2006.01)
    *C08J 5/24*         (2006.01)
    *H05K 3/46*        (2006.01)
    *B32B 37/15*       (2006.01)
    *C08L 63/06*       (2006.01)
    *H05K 1/03*        (2006.01)
    *B32B 27/26*       (2006.01)
    *B32B 27/38*       (2006.01)
    *C08L 63/02*       (2006.01)
    *C08L 61/06*       (2006.01)
    *C08G 14/06*       (2006.01)
    *C08L 61/34*       (2006.01)
    *B32B 38/16*       (2006.01)

(56) References Cited

FOREIGN PATENT DOCUMENTS

| CN | 103214794 A | | 7/2013 | |
|---|---|---|---|---|
| CN | 103589117 A | | 2/2014 | |
| CN | 104017327 A | | 9/2014 | |
| JP | 2005-272722 A | * | 10/2005 | ............. C08G 59/40 |

OTHER PUBLICATIONS

Machine translation of CN 103214794 A (no date).*
International Search Report PCT/CN2014/093414; International Filing Date: Dec. 10, 2014; 2 Pgs.

* cited by examiner

HIGH-CTI AND HALOGEN-FREE EPOXY RESIN COMPOSITION FOR COPPER-CLAD PLATES AND USE THEREOF

CROSS-REFERENCE TO RELATED APPLICATIONS

This application claims priority to PCT Application No. PCT/CN2014/093414, having a filing date of Dec. 10, 2014, based on CN 201410515073.4, having a filing date of Sep. 29, 2014, the entire contents both of which are hereby incorporated by reference.

FIELD OF TECHNOLOGY

The following refers to the field of polymer materials, and it particularly refers to a resin composition which has the properties such as high CTI (Comparative Tracking Index), high heat resistance, and the like, and is applied in the circuit boards of the electric machines, electrical appliance and white goods and so on.

BACKGROUND

With the rapid development of science and technology, the formation of large-scale industrial integration has caused irreparable damages to the human living environment, and it has become very urgent for environmental protection. In recent years, electronic technology has been developing rapidly and the electronic products, especially the electronic waste products, increasingly affect the environment. At present, most of the electronic products are flame retardant by halogenated compounds which smell awful, and will generate a large amount of smoke, as well as release highly corrosive halogen hydride gases when they burn. It has been reported that carcinogenic substances such as dioxin and dibenzofuran are generated when the halogen-containing flame retardants are pyrolyzed under high temperature or burned. Europe has issued the *Waste Electrical and Electronic Equipment Directive* and the *Directive on the Restriction of the Use of Certain Hazardous Substances in Electrical and Electronic Equipment*, and it has been stipulated that the electronic products should not contain six substances such as lead, cadmium, mercury and hexavalent chromium, etc. since Jul. 1, 2006. Japan has also issued decrees about the halogen-free flame retardings, especially SONY has announced that all materials they use would be halogen-free materials. So, it is imperative to develop halogen-free and flame retardance substrate materials and this has become the technical focal point in the industry.

On the other hand, the safety of human life has attracted increasing concern from the society. In order to improve the safety and reliability of the electronic products, especially the safety and reliability of insulation materials (e.g. used for electrical machines, electrical appliances, etc.) applied in the conditions of humid environment, it has become an important developing direction to develop products with high insulation to ensure the safety and reliability of electronic products in recent years. The tested CTI (Comparative Tracking Index) of the copper-clad plate made of polymer materials refers to the highest voltage value measured after 50 drops of electrolyte (0.1% ammonium chloride aqueous solution) have been dropped on the surface of a material without forming any tracks To some extent, the CTI value is used to measure the insulating safety performance of the material, and the higher the value is, the better the insulation property the material has. Hence, the high-CTI products have become a trend of search and development in the electronics industry.

In recent years, high-CTI materials are mainly CEM-3 materials. However, since the lead-free standard has been performed in electronic and electrical industries and other related industries, the increasing requirements for the high-temperature environment where the products are applied are introduced accordingly, and new requirements are raised for the heat resistance of the materials. Therefore, the CEM-3 material cannot reach the above requirements. In addition, the problem of poor heat resistance is also existed in the existing high-CTI FR4 plates which are commonly cured with dicyandiamide, and the CTI of such plate is improved by adding aluminium hydroxide, thus resulting in poor heat resistance. So, it is urgent for the industry to develop a resin composition with both good heat resistance and high CTI, used in the circuit boards.

SUMMARY

An aspect relates to a halogen-free epoxy resin composition with high CTI and good heat resistance, used for copper-clad plates.

Another aspect relates to applications of the above halogen-free epoxy resin composition.

In order to achieve the aspect, the following provides the following technical solution:

a high-CTI and halogen-free epoxy resin composition for copper-clad plates has a formula comprising 100~140 parts of halogen-free phosphorous epoxy resin, 10~35 parts of dicyclopentadiene phenolic epoxy resin, 1~5 parts of phenolic resin, 32~60 parts of benzoxazine, 0.05~0.5 parts of accelerants, 25~70 parts of fillers, by weight.

Further, the halogen-free phosphorous epoxy resin is synthesized as following steps: weighting the ingredients according to the formula which comprises 55~75% of epoxy resin and 25~45% of reactive phosphorous compounds, by weight; wherein the epoxy resin is straight-chain epoxy resin;

1) preparation of the halogen-free phosphorous epoxy resin by adding the straight-chain epoxy resin and the reactive phosphorous compounds into the reactor to dissolve them at a raised temperature; adding the accelerants at a temperature in a range from 110 to 130° C., raising the temperature to 170~190° C. to keep a reaction for 2~4 hours; adding solvents to dissolve them after the temperature is decreased, whereby to obtain a halogen-free phosphorous epoxy resin with a solid content of 65~75%, a phosphorus content of 2.5~4.5% and an epoxy equivalent weight of 500~1000 g/eq.

The mass ratio of the accelerants and the reactive phosphorous compounds is 0.05~0.15:100, preferably is 0.1~100; the accelerants can be selected from triphenylphosphine, triphenyl phosphate, quaternary ammonium salts or quaternary phosphonium salts.

More preferably, the straight-chain epoxy resin may be one or at least two selected from a group consisting of the bisphenol A (BPA) epoxy resin, the bisphenol F (BPF) epoxy resin and the bisphenol S linear epoxy resin. The reactive phosphorous compounds may be one or two selected from DOPO-HQ and DOPO-NQ, and the solvents in step 2) maybe one or at least two selected from the group consisting of butanone, propylene glycol monomethyl ether and cyclohexanone.

The dicyclopentadiene phenolic epoxy resin, available from DIC Co. in Japan, has a structural formula as follows:

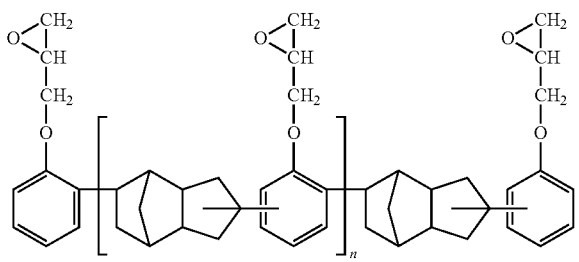

Further, the benzoxazine may be one or at least two selected from a group consisting of the bisphenol A (BPA) benzoxazine, the bisphenol F (BPF) benzoxazine and the diaminodiphenylmethane (DDM) benzoxazine.

Further, the phenolic resin may be one or at least two selected from a group consisting of the linear phenolic resin, the o-cresol formaldehyde resin and the bisphenol A (BPA) phenolic resin.

Preferably, the accelerants may be one or at least two selected from the imidazole compounds of 2-methylimidazole, 2-ethyl-4-methylimidazole and 2-phenylimidazole.

Preferably, the fillers may be one or two selected from aluminium hydroxide and magnesium hydroxide.

The above-mentioned high-CTI halogen-free epoxy resin composition for copper-clad plate can be used in preparation of the laminated boards of printed circuits.

In the application, the aforesaid epoxy resin composition is mixed with organic solvents to obtain a composition with a solid content of 50~70%, in which the glass fibre fabrics are immersed later, then the immersed glass fibre fabrics are dried into prepregs after heating. Copper foils are placed on one or both surfaces of the prepregs to form laminations of one or more prepregs, which are then heated and pressurized to obtain copper clad laminates, at a curing temperature of 50~250° C.

The organic solvents may be one or at least two selected from a group consisting of butanone, propylene glycol monomethyl ether, cyclohexanone and propylene glycol methyl ether acetate.

The high-CTI and halogen-free epoxy resin composition for copper-clad plates of embodiments of the present invention can form plates having properties of high CTI, high heat resistance, and the like, and the performances like CTI and heat resistance, etc. are relatively good. The copper-clad plates, prepared according to embodiments of the present invention, can reach the requirements for high CTI (CTI≥500V), high heat resistance (Tg≥150° C., PCT, 2 h>6 min) and flame retardance level of UL-94 V0, and they are widely used in the electronic materials of electric machines, electric appliances and white goods and so on.

DETAILED DESCRIPTION

Embodiments of the invention provides a high-CTI and halogen-free epoxy resin composition for copper-clad plates, which has a formula comprising 100~140 parts of halogen-free phosphorous epoxy resin, 10~35 parts of dicyclopentadiene phenolic epoxy resin, 32~60 parts of benzoxazine, 1~5 parts of phenolic resin, 0.05~0.5 parts of accelerants and 25~70 parts of fillers, by weight.

The halogen-free phosphorous epoxy resin is prepared by the reaction of the straight-chain epoxy resin and the reactive phosphorous compounds, and the obtained halogen-free phosphorous epoxy resin has a phosphorus content of 2.5~4.5% and an epoxy equivalent weight of 500~1000 g/eq.

Such resin, whose main part is straight-chain phosphorous epoxy resin, has high CTI, good flame retardance, toughness and cohesiveness. The straight-chain epoxy resin may be bisphenol A (BPA) epoxy resin, the bisphenol F (BPF) epoxy resin or the bisphenol S linear epoxy resin. The reactive phosphorous compounds can be one or two selected from DOPO-HQ and DOPO-NQ. The epoxy resin can be synthesized as following steps:

1) weighting the ingredients according to the formula which comprises 55~75% of epoxy resin and 25~45% of reactive phosphorous compounds, by weight; wherein the epoxy resin is straight-chain epoxy resin;

2) preparation of the halogen-free phosphorous epoxy resin, by adding the straight-chain epoxy resin and the reactive phosphorous compounds into the reactor to dissolve them at an increased temperature; adding the accelerants at a temperature in a range from 110 to 130° C., raising the temperature to 170~190° C. to keep a reaction for 2~4 hours; adding solvents to dissolve them after the temperature is decreased, whereby to obtain a solid content of 65~75%; wherein, the mass ratio of the accelerants and the reactive phosphorous compounds is 0.05~0.15:100, preferably is 0.1~100, and the accelerants can be one or at least two selected from a group consisting of triphenylphosphine, triphenyl phosphate, quaternary ammonium salts or quaternary phosphonium salts. The solvents in step 2) may be one or at least two selected from a group consisting of butanone, propylene glycol monomethyl ether and cyclohexanone.

The dicyclopentadiene phenolic epoxy resin has a structural formula as follows:

Such kind of resin having a high heat resistance and chemical stability, and good

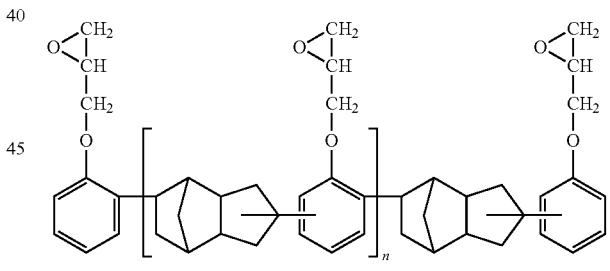

flame retardance, can be used to improve the CTI of the composition.

The benzoxazine is a type of nitrogenous phenolic aldehyde compound synthesized by phenols, aldehydes and amines, and it has an excellent heat resistance and flame retardance. The phosphorus-nitrogen synergistic effect, achieved between the nitrogenous structure and the phosphorous epoxy, can improve the flame retardance of the products. The benzoxazine can be one or at least two selected from a group consisting of the bisphenol A (BPA) benzoxazine, the bisphenol F (BPF) benzoxazine and the diaminodiphenylmethane (DDM) benzoxazine.

The phenolic resin has a high heat resistance and may be one or at least two selected from a group consisting of the linear phenolic resin, the o-cresol formaldehyde resin and the bisphenol A (BPA) phenolic resin.

The accelerants may be one or at least two selected from the imidazole compounds of 2-methylimidazole, 2-ethyl-4-methylimidazole and 2-phenylimidazole.

The fillers may be one or two of aluminium hydroxide and magnesium hydroxide.

The above-mentioned high-CTI and halogen-free epoxy resin composition for copper-clad plates can be used in the preparation of the laminated boards of printed circuits.

In the application, the aforesaid epoxy resin composition is mixed with organic solvents to obtain a composition with a solid content of 50~70%, in which the glass fibre fabrics are immersed later, then the immersed glass fibre fabrics are dried into prepregs after heating. Copper foils are placed on one or both surfaces of the prepregs to form laminations of one or more prepregs, which are then heated and pressurized to obtain copper clad laminates at a curing temperature of 50~250° C. The organic solvents may be one or at least two selected from a group consisting of butanone, propylene glycol monomethyl ether, cyclohexanone and propylene glycol methyl ether acetate.

Embodiments of the invention will be further explained with reference to preferable examples, without any limitation to the embodiments of the present invention. The designations and ingredients in the examples and comparative examples are listed as below:

Resin 1: the halogen-free phosphorous epoxy resin (A1) of the invention is synthesized as following process: adding the liquid BPA epoxy resin (60~70%) and the reactive phosphorous compounds (30~40%) into the reactor to dissolve them at an increased temperature; adding the triphenylphosphine (TPP) accelerant at 120° C. and keeping a reaction for 2~4 hours when the temperature is increase to 170~190° C., then adding cyclohexanone to dissolve them after the temperature is decreased, thus to obtain a resin having a solid content of 70%, a phosphorus content of 3.0~4.0% and an epoxy equivalent weight of 700~900 g/eq.

Resin 2: The halogen-free phosphorous epoxy resin (A2) of embodiments of the invention is synthesized as following process: adding the liquid BPF epoxy resin (60~70%) and the reactive phosphorous compounds (35~45%) into the reactor to dissolve them at an increased temperature, adding the triphenylphosphine (TPP) accelerant at 120° C., raising the temperature to 170~190° C., to keep a reaction for 2~4 hours, then adding cyclohexanone to dissolve them after the temperature is decreased, thus to obtain a resin having a solid content of 70%, a phosphorus content of 3.0~4.0% and an epoxy equivalent weight of 700~900 g/eq.

Resin 3: dicyclopentadiene phenolic epoxy resin 7200HHH, available from the DIC Corporation in Japan.

Resin 4: o-cresol formaldehyde epoxy resin 704, available from the South Asia Corporation.

Resin 5: halogen-free resin produced by ZHUHAI EPOXY BASE Electronic Material Co., LTD, with a trade name of GEBR589K75.

Curing agent 1: diaminodiphenylmethane (DDM) benzoxazine.

Curing agent 2: phenolic resin GERH833K65, available from HongChang ZHUHAI EPOXY BASE Electronic Material Co., LTD Curing agent 3: dicyandiamide, 10 wt %, dissolved in DMF (dimethyl formamide)

Filler: aluminium hydroxide

Curing accelerator 2PI: 2-phenylimidazole, 1 wt %, dissolved in PM (propylene glycol monomethyl ether)

Glass fibre fabric: Fabric 7628.

Example 1

The ingredients of A1 and 7200HHH of embodiments of the present invention are used as the main resin, mixed with curing agents of DDM benzoxazine and phenolic resin GERH833K65, and a filler of aluminium hydroxide, and the formula composition is listed in detail in Table 1. The butanone (MEK), propylene glycol monomethyl ether (PM) or propylene glycol methyl ether acetate are added to obtain a varnish composition with a solid content of 55%, and the glass fibre fabric 7628 is immersed in the above mentioned varnish resin liquid and dried at a temperature of 170~180° C. in the impregnation machine for a few minutes, to obtain a dried prepreg whose melt viscosity is 800~1000 Pa·s by adjusting and controlling the drying time. Finally eight layers of prepregs are laminated to each other between two copper foils with a thickness of 35 μm, and are pressurized at a pressure of 25 Kg/cm² and in a temperature-controlling process as follows:

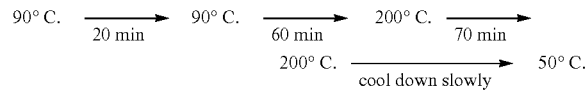

After the hot-pressing, a copper-clad plate with a thickness of 1.6 mm is obtained. The CTI of the composition can be greater than 500V, and the Tg can be higher than 150° C., thus a good heat resistance and a flame retardance level of V0 are achieved. The performances are shown in detail in Table 1.

Example 2

Repeat Example 1, change the content of the ingredients of A1 and 7200HHH, and the CTI of the obtained composition can be greater than 500V, and the Tg can be higher than 150° C., thus a good heat resistance and a flame retardance level of V0 are achieved. The performances are shown in detail in Table 1.

Example 3

The ingredients of A2 and 7200HHH of embodiments of the present invention are used as the main resin, mixed with curing agents of DDM benzoxazine and phenolic resin GERH833K65, and a filler of aluminium hydroxide and the formula of the composition is listed in detail in Table 1. Repeat the process of preparing the plate in Example 1. The CTI of the obtained composition can greater than 500V, and the Tg can be higher than 150° C., thus a good heat resistance and a flame retardance level of V0 are achieved. The performances are shown in detail in Table 1.

Example 4

Repeat Example 3, change the contents of the ingredients of A2 and 7200HHH, and the CTI of the obtained composition can greater than 500V, and the Tg can be higher than 150° C., thus a good heat resistance and a flame retardance level of V0 are achieved. The performances are shown in detail in Table 1.

Comparative Example 1

Repeat Example 4, and replace the ingredient 7200HHH with the ingredient 704, and the obtained composition has a fine heat resistance, but its CTI is less than 400V, and the flame retardance level is only Level V1. The performances are shown in detail in Table 1.

Comparative Example 2

The GEBR589K75 is used as the main resin, mixed with a curing agent of dicyandiamide. Repeat the process of preparing copper-clad plates in Example 1, and the obtained composition has a poor heat resistance (the lasting time is less than 6 min for popcorn in Pressure Cooker Test (PCT), and is less than 60 min in T288). The performances are shown in detail in Table 1.

Comparative Example 3

Repeat Comparative Example 2, and the curing agents are diaminodiphenylmethane (DDM) benzoxazine and phenolic resin GERH833K65 instead. The obtained composition has an unsatisfied CTI and a poor flame retardance, specifically, the CTI is less than 400V, and the level of flame retardance is only level V1. The performances are shown in detail in Table 1.

Descriptions of Measurement
1) Gelling time of varnish (sec):
   0.3 mL resin varnish is placed on a gel timer, and its gelling time is measured.
2) Glass transition temperature (Tg, ° C.):
   It is measured according to 2.4.25 par. of IPC-TM-650.
3) Peel strength (lb/in):
   It is measured according to 2.4.8 par. of IPC-TM-650.
4) Popcorn in Pressure Cooker Test (PCT) (min):
   The samples are cooked in the pressure cooker at a pressure of 2 atmosphere and a temperature of 120° C. for 2 hours, then they are immersed in a tin stove at 288° C., and the time for delamination is measured.
5) Comparative Tracking Index (CTI) (V, 50D):
   It is measured according to GB/T 4207-2003.
6) T288 test (min):
   The delamination time of the samples is measured by the thermomechanical analysis (TMA) method.
7) Flame retardance
   It is measured according to vertical burning test of UL94.

Advantageous Effects

It can be found from the performances results of Examples 1-4 and Comparative Examples 1-3 as shown in Table 1 that: in embodiments of the present invention, the high-CTI, halogen-free and phosphorous epoxy resin, mixed with the curing agents of DDM benzoxazine and phenolic resin, can prepare plates having the features of high CTI, high heat resistance, and the like.

Embodiments of the invention should not be limited to those embodiments described above, which are just preferable embodiments, and any changes, modifications, substitution, combination and simplification, without departing from the spirit essence and principle of embodiments of the present invention, are equivalent replacement, and also be included in the scope of embodiments of the present invention.

TABLE 1

The ingredients of the formulas of resin varnishes and their properties

|  | Example 1 | Example 2 | Example 3 | Example 4 | Comparative Example 1 | Comparative Example 2 | Comparative Example 3 |
|---|---|---|---|---|---|---|---|
| Resin 1 the resin of embodiments of the present invention A1 | 130 | 120 |  |  |  |  |  |
| Resin 2 the resin of embodiments of the present invention A2 |  |  | 115 | 100 | 100 |  |  |
| Resin 3 7200HHH | 10 | 15 | 20 | 30 |  |  |  |
| Resin 4 704 |  |  |  |  | 30 |  |  |
| Resin 5 GEBR589K75 |  |  |  |  |  | 100 | 100 |
| Curing agent 1 DDM benzoxazine (PHR) | 35 | 40 | 45 | 50 | 50 |  | 50 |
| Curing agent 2 GERH833K65 (PHR) | 3 | 3 | 3 | 3 | 3 |  | 3 |
| Curing agent 3 dicyandiamide (PHR) |  |  |  |  |  | 26 |  |
| Filler aluminium hydroxide (PHR) | 40 | 45 | 45 | 45 | 45 | 40 | 40 |
| Aaccelerant 2-PI (PHR) | 0.13 | 0.1 | 0.1 | 0.1 | 0.1 | 0.1 | 0.1 |
| Gelling time of varnish (sec) | 295 | 290 | 273 | 302 | 297 | 260 | 305 |
| Glass transition temperature (° C.) | 153 | 155 | 153 | 157 | 159 | 154 | 160 |
| Peel strength (lb/in) | 10.2 | 9.8 | 9.5 | 9.8 | 9.2 | 9.0 | 8.0 |
| Popcorn in PCT (120° C., 2 h, min) | 6↑ | 6↑ | 6↑ | 6↑ | 6↑ | 1↓ | 6↑ |
| CTI (V, 50 D) | 500↑ | 500↑ | 500↑ | 500↑ | 400↓ | 400 | 400↓ |
| T288 (min) | 60↑ | 60↑ | 60↑ | 60↑ | 60↑ | 5↓ | 60↑ |
| Flame retardance | 94 V-0 | 94 V-0 | 94 V-0 | 94 V-0 | 94 V-1 | 94 V-0 | 94 V-1 |

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

The invention claimed is:

1. A high-CTI and halogen-free epoxy resin composition for copper-clad plates, comprising:
    100 to 140 parts by weight of halogen-free phosphorous epoxy resin;
    10 to 35 parts by weight of dicyclopentadiene phenolic epoxy resin;
    1 to 5 parts by weight of phenolic resin;
    32 to 60 parts by weight of benzoxazine;
    0.05 to 0.5 parts by weight of curing accelerant; and
    25 to 70 parts by weight of filler.

2. The high-CTI and halogen-free epoxy resin composition for copper-clad plates according to claim 1, wherein the halogen-free phosphorous epoxy resin is synthesized by:
    (1) weighting a straight-chain epoxy resin and a reactive phosphorous compound such that, when combined for reaction, the straight-chain epoxy resin accounts for 55~75% by weight and the reactive phosphorous compound accounts for 25~45% by weight, of a combined weight of the straight chain epoxy resin and the reactive phosphorous compound;
    (2) preparing the halogen-free phosphorous epoxy resin, by: adding the weighted straight-chain epoxy resin and the weighted reactive phosphorous compound into a reactor to dissolve them at an increased temperature; adding a reaction accelerant at 110~130° C.; raising the temperature to a reaction temperature of 170~190° C.; maintaining the reaction temperature for 2~4 hours; decreasing the temperature; and adding solvents for dissolution, thus to obtain the halogen-free phosphorous epoxy resin with a solid content of 65~75%, a phosphorus content of 2.5~4.5% and an epoxy equivalent weight of 500~1000 g/eq.

3. The high-CTI and halogen-free epoxy resin composition for copper-clad plates according to claim 2, wherein the straight-chain epoxy resin is one or at least two selected from the group consisting of BPA epoxy resin, BPF epoxy resin and bisphenol S linear epoxy resin; and the reactive phosphorous compounds are one or two of DOPO-HQ and DOPO-NQ.

4. The high-CTI and halogen-free epoxy resin composition for copper-clad plates according to claim 2, wherein the benzoxazine is one or more selected from the group consisting of BPA benzoxazine, BPF benzoxazine and DDM benzoxazine.

5. The high-CTI and halogen-free epoxy resin composition for copper-clad plates according to claim 2, wherein the phenolic resin is one or more selected from the group consisting of linear phenolic resin, o-cresol formaldehyde resin and BPA phenolic resin.

6. The high-CTI and halogen-free epoxy resin composition for copper-clad plates according to claim 2, wherein the accelerants are one or more of 2-methylimidazole, 2-ethyl-4-methylimidazole and 2-phenylimidazole.

7. The high-CTI and halogen-free epoxy resin composition for copper-clad plates according to claim 2, wherein a mass ratio of the reaction accelerant and the reactive phosphorous compound is 0.05~0.15:100; and wherein the reaction accelerant is triphenylphosphine, triphenyl phosphate, quaternary ammonium salts or quaternary phosphonium salts.

8. The high-CTI and halogen-free epoxy resin composition for copper-clad plates according to claim 7, wherein the straight-chain epoxy resin is one or at least two selected from the group consisting of BPA epoxy resin, BPF epoxy resin and bisphenol S linear epoxy resin; and the reactive phosphorous compounds are one or two of DOPO-HQ and DOPO-NQ.

9. The high-CTI and halogen-free epoxy resin composition for copper-clad plates according to claim 7, wherein the benzoxazine is one or more selected from the group consisting of BPA benzoxazine, BPF benzoxazine and DDM benzoxazine.

10. The high-CTI and halogen-free epoxy resin composition for copper-clad plates according to claim 7, wherein the phenolic resin is one or more selected from the group consisting of linear phenolic resin, o-cresol formaldehyde resin and BPA phenolic resin.

11. The high-CTI and halogen-free epoxy resin composition for copper-clad plates according to claim 7, wherein the accelerants are one or more of 2-methylimidazole, 2-ethyl-4-methylimidazole and 2-phenylimidazole.

12. The high-CTI and halogen-free epoxy resin composition for copper-clad plates according to claim 1, wherein the benzoxazine is one or more selected from the group consisting of BPA benzoxazine, BPF benzoxazine and DDM benzoxazine.

13. The high-CTI and halogen-free epoxy resin composition for copper-clad plates according to claim 1, wherein the phenolic resin is one or more selected from the group consisting of linear phenolic resin, o-cresol formaldehyde resin and BPA phenolic resin.

14. The high-CTI and halogen-free epoxy resin composition for copper-clad plates according to claim 1, wherein the accelerants are one or more of 2-methylimidazole, 2-ethyl-4-methylimidazole and 2-phenylimidazole.

15. A method for preparing laminated boards of printed circuits, comprising steps of: preparing the high-CTI and halogen-free epoxy resin composition for copper-clad plates of claim 1; and applying the composition to at least one substrate to prepare laminated boards of printed circuits.

16. The method according to claim 15, further comprising mixing the epoxy resin composition with organic solvent to obtain a solvent-based composition with a solid content of 50~70%; and wherein said applying comprises: immersing a glass fibre fabric substrate in the solvent-based composition; drying the immersed glass fibre fabric substrate to form a prepreg; optionally stacking more than one prepreg; applying copper foil to at least one surface of the prepreg or the prepreg stack; and pressurizing and heating the resulting laminated structure at a curing temperature of 50~250° C.

17. The method according to claim 16, wherein the organic solvent is one or more selected from the group consisting of butanone, propylene glycol monomethyl ether, cyclohexanone and propylene glycol methyl ether acetate.

* * * * *